United States Patent
Satoh et al.

(10) Patent No.: US 7,534,469 B2
(45) Date of Patent: May 19, 2009

(54) SEMICONDUCTOR-PROCESSING APPARATUS PROVIDED WITH SELF-CLEANING DEVICE

(75) Inventors: Kiyoshi Satoh, Tama (JP); Yoshinobu Kano, Tama (JP)

(73) Assignee: ASM Japan K.K. (JP)

( * ) Notice: Subject to any disclaimer, the term of this patent is extended or adjusted under 35 U.S.C. 154(b) by 656 days.

(21) Appl. No.: 11/095,314

(22) Filed: Mar. 31, 2005

(65) Prior Publication Data
US 2006/0228473 A1 Oct. 12, 2006

(51) Int. Cl.
*C23C 16/00* (2006.01)
(52) U.S. Cl. .............. 427/248.1; 134/1.1; 134/1.2; 134/1.3; 134/2; 134/22.1; 134/18; 134/22.18; 118/723; 156/345.24; 156/345.25; 156/345.34; 156/345.47; 356/339; 356/246; 216/60
(58) Field of Classification Search ........... 118/429, 118/723; 156/345.24, 345.25; 134/1.1; 356/172
See application file for complete search history.

(56) References Cited

U.S. PATENT DOCUMENTS

| | | | |
|---|---|---|---|
| 5,160,402 A | 11/1992 | Cheng | |
| 5,343,412 A | 8/1994 | Birang | |
| 5,788,778 A | 8/1998 | Shang et al. | |
| 5,837,094 A | 11/1998 | Tsukazaki et al. | |
| 5,879,574 A | 3/1999 | Sivaramakrishnan et al. | |
| 5,902,403 A | 5/1999 | Aitani et al. | |
| 5,910,011 A | 6/1999 | Cruse | |
| 5,986,747 A | 11/1999 | Moran | |
| 6,051,284 A | 4/2000 | Byrne et al. | |
| 6,052,176 A * | 4/2000 | Ni et al. .................. | 356/72 |
| 6,170,492 B1 | 1/2001 | Ueda et al. | |
| 6,192,898 B1 | 2/2001 | Aitani et al. | |
| 6,366,346 B1 | 4/2002 | Nowak et al. | |
| 6,368,975 B1 | 4/2002 | Balasubramhanya et al. | |
| 6,543,459 B1 | 4/2003 | Annapragada | |
| 6,553,335 B2 | 4/2003 | Huang et al. | |
| 6,562,186 B1 * | 5/2003 | Saito et al. ............. | 156/345.24 |
| 6,635,144 B2 | 10/2003 | Cui et al. | |
| 6,652,710 B2 | 11/2003 | Cruse | |
| 6,660,101 B1 | 12/2003 | Tachibana | |
| 6,736,147 B2 | 5/2004 | Satoh et al. | |
| 6,737,666 B1 | 5/2004 | Ito et al. | |
| 2001/0008138 A1 * | 7/2001 | Demos et al. .............. | 134/1.1 |
| 2004/0045502 A1 * | 3/2004 | Yokoyama et al. .......... | 118/429 |
| 2004/0194709 A1 * | 10/2004 | Yamagishi et al. ....... | 118/723 E |

FOREIGN PATENT DOCUMENTS

| | | | |
|---|---|---|---|
| EP | 1118692 A1 * | 7/2001 | |
| EP | 1118692 A1 * | 7/2001 | |
| JP | 61-014421 | 1/1986 | |
| JP | 61-145825 | 7/1986 | |
| JP | 61-247031 | 11/1986 | |

(Continued)

*Primary Examiner*—Michael Barr
*Assistant Examiner*—Andrew Bowman
(74) *Attorney, Agent, or Firm*—Knobbe Martens Olson & Bear LLP (57) ABSTRACT

A CVD apparatus comprising an optical unit detecting the mass of contaminants adhering to an inner surface of a CVD reactor by irradiating an inner surface of the reactor with light having monochromaticity through an optical window provided on an inner wall of the reactor and receiving its reflected light is provided.

17 Claims, 6 Drawing Sheets

FOREIGN PATENT DOCUMENTS

| | | |
|---|---|---|
| JP | 63-014422 | 1/1988 |
| JP | 63-024473 | 2/1988 |
| JP | 63-128718 | 6/1988 |
| JP | 405047673 A * | 2/1993 |
| JP | 05-214531 | 8/1993 |
| JP | 06-224163 | 8/1994 |
| JP | 07-169753 | 7/1995 |
| JP | 08-321467 | 12/1996 |
| JP | 09-069504 | 3/1997 |
| JP | 63-089684 | 4/1998 |
| JP | 10-149989 | 6/1998 |
| JP | 10-163185 | 6/1998 |

* cited by examiner

SEMICONDUCTOR-PROCESSING APPARATUS PROVIDED WITH SELF-CLEANING DEVICE

BACKGROUND OF THE INVENTION

1. Field of the Invention

The present invention relates to a semiconductor-processing apparatus with a self-cleaning device; particularly to a plasma CVD apparatus with a self-cleaning device comprising a cleaning endpoint detection device.

2. Description of the Related Art

CVD apparatuses have been conventionally used to form insulation films such as silicon oxide, silicon nitride, amorphous carbon or polymer containing benzene ring, conductor films such as tungsten silicide, titanium nitride or aluminum alloy, and high-dielectric films containing $PZT(PbZr_{1-x}Ti_xO_3)$ or $BST(Ba_xSr_{1-x}TiO_3)$ on a silicon substrate or a glass substrate.

In order to form these films, reaction gas having various compositions or a second reaction gas is supplied into a reactor. These gases cause a chemical reaction by receiving plasma energy, and a desired thin film is formed on a semiconductor substrate. Inside the reactor, a film generated similarly by chemical reaction adheres to its inner wall and a susceptor surface. These adhesive substances are accumulated gradually as a film formation process onto a substrate is repeated; and then, disengaging from the inner wall and the susceptor surface, these adhesive substances sometimes float inside the reactor. This causes impurity contamination that leads to defects in manufactured semiconductor circuits.

In order to remove contaminants adhering to an inner wall of the reactor, in situ Cleaning that cleans its interior while the reactor is in operation is effective. This method is to remove adhesive substances by introducing cleaning gas, which is selected according to a type of adhesive substances, into the reactor to decompose the adhesive substances into gaseous materials. For examples, if silicon oxide or silicon nitride, tungsten or its nitride or silicide adheres, $CF_4$, C2F6, C3F8 or NF3 is used as cleaning gas. Those cleaning gases are activated by making use of a plasma excitation device and electrodes inside the reactor, which are used for film formation, and generate fluorine atoms or fluorine-containing active species. This cleaning using a plasma excitation method is called in-situ "plasma" cleaning. In this case, active species (fluorine radical) of fluorine atoms or fluorine-containing active species decomposes the substances adhering to the inner wall of the reactor and impurities can be removed in the gas phase.

In a plasma CVD apparatus, because a plasma excitation device used for film formation is also used for activation of cleaning gas, large ion bombardment is caused between electrodes by high radio frequency (RF) power applied to the cleaning gas. As a result, the surface of electrodes is damaged; a surface layer comes off to cause impurity contamination. It becomes necessary to replace damaged parts frequently, which increases operation cost.

In order to solve these shortcomings by ion bombardment, remote plasma cleaning was developed. In Japanese Patent Laid-open No. 1998-149989, Japanese Patent Laid-open No. 1998-163185, U.S. Pat. No. 5,788,778, Japanese Patent Laid-open No. 1997-69504, and Japanese Patent Laid-open No. 1993-21531, which are herein incorporated by reference, a method is disclosed in which CF-containing gas or $NF_3$ is used as cleaning gas and excitation of plasma that activates the cleaning gas is performed using microwaves in a second plasma discharge chamber, which is different and separated from the reactor. According to this method, flow-controlled $NF_3$ is introduced into the second plasma discharge chamber, it is dissociated and activated by 2.45 GHz microwaves supplied to the plasma discharge chamber from a microwave oscillator through a waveguide, and fluorine active species are generated. At this time, in order to achieve microwave plasma discharge efficiently, a valve is provided between the second plasma reaction chamber and the reactor to regulate a pressure and the second plasma reaction chamber is maintained at a designated pressure. Generated fluorine radicals are introduced into the reactor in which film formation is performed through a conduit, and decompose and remove adhesive substances on the inner wall of the reactor.

In U.S. Pat. No. 6,736,147, which is herein incorporated by reference, an apparatus in which a remote plasma chamber installed at the top of a reactor and the reactor are connected by aluminum piping and a through-flow type valve is disclosed.

These reactor cleaning processes after film formation are performed by taking sufficient time to remove unnecessary reaction products adhering to the interior of the reactor.

By finding sufficient cleaning time according to a thickness of a film to be formed on a wafer by performing test cleaning in advance, reactor cleaning is performed by storing time data in a self-cleaning device.

In a localized plasma cleaning method in which cleaning gas is activated in a plasma region formed inside a reactor by applying radio-frequency power to electrodes disposed inside the reactor, a method of confirming an endpoint of cleaning the interior of the reactor using plasma emission between the electrodes or voltage/current information of a radio-frequency power supply line is disclosed (for example, in U.S. Pat. No. 5,910,011, U.S. Pat. No. 6,652,710 B2, U.S. Pat. No. 5,160,402, U.S. Pat. No. 5,343,412, U.S. Pat. No. 5,986,747, U.S. Pat. No. 6,368,975 B1, Japanese Patent Laid-open No. 1988-128718, Japanese Patent Laid-open No. 1996-321467, U.S. Pat. No. 6,051,284, Japanese Patent Laid-open No. 1988-14422, Japanese Patent Laid-open No. 1986-145825, Japanese Patent Laid-open No. 1988-89684, Japanese Patent Laid-open No. 1988-14421, Japanese Patent Laid-open No. 1988-244739, Japanese Patent Laid-open No. 1986-247031, Japanese Patent Laid-open No. 1995-169753).

This cleaning endpoint detection is an important item to find whether cleaning of the interior of the reactor has been reliably completed or not; when the cleaning has not been completed within predetermined time, stopping or maintenance of an apparatus is requested based on this information.

In a remote plasma cleaning method using a remote plasma chamber, however, because radio-frequency power is not applied to electrodes inside a reactor, the above-mentioned plasma emission or voltage/current information of a radio-frequency power supply line cannot be obtained.

Consequently, in order to determine whether cleaning of the interior of a reactor has been completed or not, a method using an infrared absorption spectroscope by mounting it at an exit of the reactor, a method using a quadrupole mass spectrometer, etc. are devised. For example, such techniques are disclosed in U.S. Pat. No. 5,879,574, U.S. Pat. No. 6,543,459 B1, U.S. Pat. No. 5,837,094, U.S. Pat. No. 6,660,101 B1, U.S. Pat. No. 6,737,666 B1, U.S. Pat. No. 6,553,335 B2, U.S. Pat. No. 6,366,346 B1, U.S. Pat. No. 6,635,144 B2, Japanese Patent Laid-open No. 1994-224163, U.S. Pat. No. 6,170,492 B1, U.S. Pat. No. 5,902,403, U.S. Pat. No. 6,192,898 B1.

Because a cleaning reaction takes place in the interior of a reactor and further in a region in which reaction products adhering to the interior of vacuum exhaust piping directly connected to the reactor are present, by detecting a cleaning endpoint in a reactor exhaust piping portion, it is possible to estimate a cleaning endpoint inside the reactor to some extent. However, because a state, an amount generated, a temperature, etc. of reaction products adhering to the reactor exhaust piping portion do not necessarily have constant correlation with those inside the reactor, accurate information of the interior of the reactor cannot be detected by the above-mentioned cleaning endpoint detection device installed in the reactor exhaust piping portion. As a result, cleaning time is set rather longer than it should be so as to allow sufficient time, thereby lowering throughput, i.e., substrate processing capacity of an apparatus. Further, there are problems such that, in a method using infrared absorption, due to contamination of a window portion provided in an exhaust piping portion through which infrared rays are transmitted, optical signals obtained are changed; in a method using a quadrupole mass spectrometer, a detection device itself is changed in quality by fluorine-containing active species. It is difficult to perform stable cleaning endpoint detection on a long-term basis, which is required for plants mass-producing semiconductor devices.

It goes without saying that a semiconductor wafer is contaminated inside the reactor by particles and semiconductor device defects are caused if film formation process for a subsequent semiconductor wafer is performed without completing the cleaning.

SUMMARY OF THE INVENTION

In view of the above-mentioned problems in conventional techniques, in an embodiment of the present invention, one of the objects is to perform efficient and clean reactor cleaning.

Additionally, in an embodiment, one of the objects is to provide a plasma CVD apparatus which can detect whether reactor cleaning has been reliably completed or not.

Further, in an embodiment, one of the objects is to provide a plasma CVD apparatus with high throughput which can complete a cleaning sequence swiftly by adequately detecting completion of the cleaning and proceed to the next process.

Further, in an embodiment, one of the objects is to provide a cleaning endpoint detection device which can be used not only with remote plasma cleaning but also with in situ plasma cleaning.

In an embodiment of the present invention, the present invention provides a CVD apparatus comprising: I) a CVD reactor, and II) an optical unit detecting the mass of contaminants adhering to an inner surface of the CVD reactor by irradiating the inner surface of the reactor with light having monochromaticity through an optical window provided on an inner wall of the reactor and receiving its reflected light.

The above-mentioned embodiments further include the following aspects:

The CVD apparatus, wherein the light having monochromaticity is monochromatic light.

The CVD apparatus, wherein the light having monochromaticity is laser light.

The CVD apparatus, wherein the optical unit is a single device which performs both irradiation with light having monochromaticity and receiving of its reflected light.

The CVD apparatus, wherein the CVD reactor comprises a showerhead for introducing a reaction gas into the reactor and a susceptor disposed facing the showerhead for placing and heating a substrate thereon, wherein the inner surface of the reactor is a part of the showerhead.

The CVD apparatus, wherein the inner surface is a plane in the vicinity of a periphery of the showerhead facing the susceptor.

The CVD apparatus, wherein the optical window is provided on an inner wall of the CVD reactor, which is situated in a direction perpendicular to the inner surface.

The CVD apparatus, wherein the inner surface is a side surface in the vicinity of the periphery of the showerhead.

The CVD apparatus, wherein the optical window is provided on an inner wall of the CVD reactor, which is situated in a direction perpendicular to the inner surface.

The CVD apparatus, wherein the optical window is composed of sapphire.

The CVD apparatus, wherein the optical unit detects the mass of contaminants by converging interference signals of reflected lights of the light having monochromaticity from the inner surface and from a surface of the contaminants.

The CVD apparatus, wherein the optical unit detects the mass of contaminants by reflected light intensity of the light having monochromaticity from the inner surface.

The CVD apparatus, which further comprises a purge gas inlet port disposed in the vicinity of the optical window, for introducing a purge gas for protecting a surface of the optical window from a deposition atmosphere during film formation.

The CVD apparatus, which further comprises an exhaust balancer disposed in the vicinity of the optical window, for exhausting a purge gas for protecting a surface of the optical window without allowing the purge gas to flow into the deposition atmosphere.

The CVD apparatus, wherein the optical window is provided at a bottom of a bottomed-hole provided in an inner wall of the reactor.

The CVD apparatus, which further comprises a remote plasma discharge chamber for a cleaning gas.

Additionally, according to an alternative embodiment of the present invention, the present invention provides a method of cleaning a CVD apparatus which comprises the steps of: I) Removing contaminants adhering to the interior of a CVD reactor by activated cleaning gas, II) detecting a removal state of contaminants adhering to an inner surface of the reactor by irradiating the inner surface of the reactor with light having monochromaticity through an optical window provided on an inner wall of the reactor and receiving its reflected light, III) controlling the cleaning step based on detection results.

The above-mentioned embodiments further include the following aspects:

The method of cleaning a CVD apparatus, wherein the light having monochromaticity is monochromatic light.

The method of cleaning a CVD apparatus, wherein the light having monochromaticity is laser light.

The method of cleaning a CVD apparatus, wherein both irradiation with light having monochromaticity and receiving of its reflected light are performed through the same optical window.

The method of cleaning a CVD apparatus, wherein the inner surface is a surface of a showerhead introducing reaction gas into the reactor.

The method of cleaning a CVD apparatus, wherein the inner surface is a plane in the vicinity of a periphery of the showerhead facing a susceptor for placing and heating a substrate thereon.

The method of cleaning a CVD apparatus, wherein the optical window is provided on an inner wall of the CVD reactor, which is situated in a direction perpendicular to the inner surface.

The method of cleaning a CVD apparatus, wherein the inner surface is a side surface in the vicinity of a periphery of the showerhead.

The method of cleaning a CVD apparatus, wherein the optical window is provided on an inner wall of the CVD reactor, which is situated in a direction perpendicular to the inner surface.

The method of cleaning a CVD apparatus, wherein the optical window is composed of sapphire.

The method of cleaning a CVD apparatus, wherein removal of contaminants is detected by converging interference signals of reflected lights of the light having monochromaticity from the inner surface and from a surface of the contaminants.

The method of cleaning a CVD apparatus, wherein the mass of the contaminant is detected by reflected light intensity of the light having monochromaticity from the inner surface.

The method of cleaning a CVD apparatus, wherein the detection process is performed through the optical window provided at a bottom of a bottomed-hole provided in an inner wall of the reactor.

The method of cleaning a CVD apparatus, wherein the activated cleaning gas is cleaning gas excited in a remote plasma discharge chamber.

In still an alternative embodiment of the present invention, the present invention provides a method of forming a film by CVD, in which any one of the above-mentioned cleaning methods is incorporated, and which comprises the steps of: I) Forming a film on a substrate inside the CVD reactor, II) during the film formation, introducing a purge gas for protecting a surface of the optical window from a deposition atmosphere into the vicinity of the optical window, and III) after completion of the film formation, performing any one of the above-mentioned cleaning.

The above-mentioned embodiments further include the following aspects:

The method of forming a film which further comprises exhausting a purge gas for protecting the optical window without allowing the purge gas to flow into the deposition atmosphere during the film formation.

Additionally, the present invention is not limited to the above-mentioned embodiments or aspects; for example, any element used in an embodiment can interchangeably be used in another embodiment, and any combination of elements can be applied in these embodiments, unless it is not feasible. Additionally, it is to be understood that no necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

The present invention will now be described with reference to the drawings which are intended to illustrate an embodiment and not to limit the present invention. Additionally, the drawings are oversimplified for illustration purposes.

DETAILED DESCRIPTION OF THE PREFERRED EMBODIMENT

In order to achieve the above-mentioned objects, a plasma CVD apparatus according to the present invention comprises the following means:

In a substrate processing apparatus comprising a reactor, a remote plasma discharge chamber disposed remotely from the reactor, and piping connecting the reactor and the remote plasma discharge chamber, which cleans the interior of the reactor by activating cleaning gas by plasma discharge energy excited in the remote plasma discharge chamber, introducing the activated cleaning gas through the piping into the reactor, and decomposing solid materials adhering to the interior of the reactor into gaseous materials, a method of self-cleaning comprising a step of removing products adhering to the interior of the reactor by activated cleaning gas, in which progress of a substrate-processing sequence is controlled by irradiating electrodes for reaction gas excitation provided inside the reactor with monochromatic light from the exterior of the reactor, receiving its reflected lights by an optical receiver provided outside the reactor, and detecting a removal state of products adhering to the interior of the reactor based on information of the intensity of reflected lights obtained, and a device for the same are provided.

Embodiments of the present invention will now be described with reference to the drawings, but the present invention is not limited to these embodiments and drawings.

Figure 1:
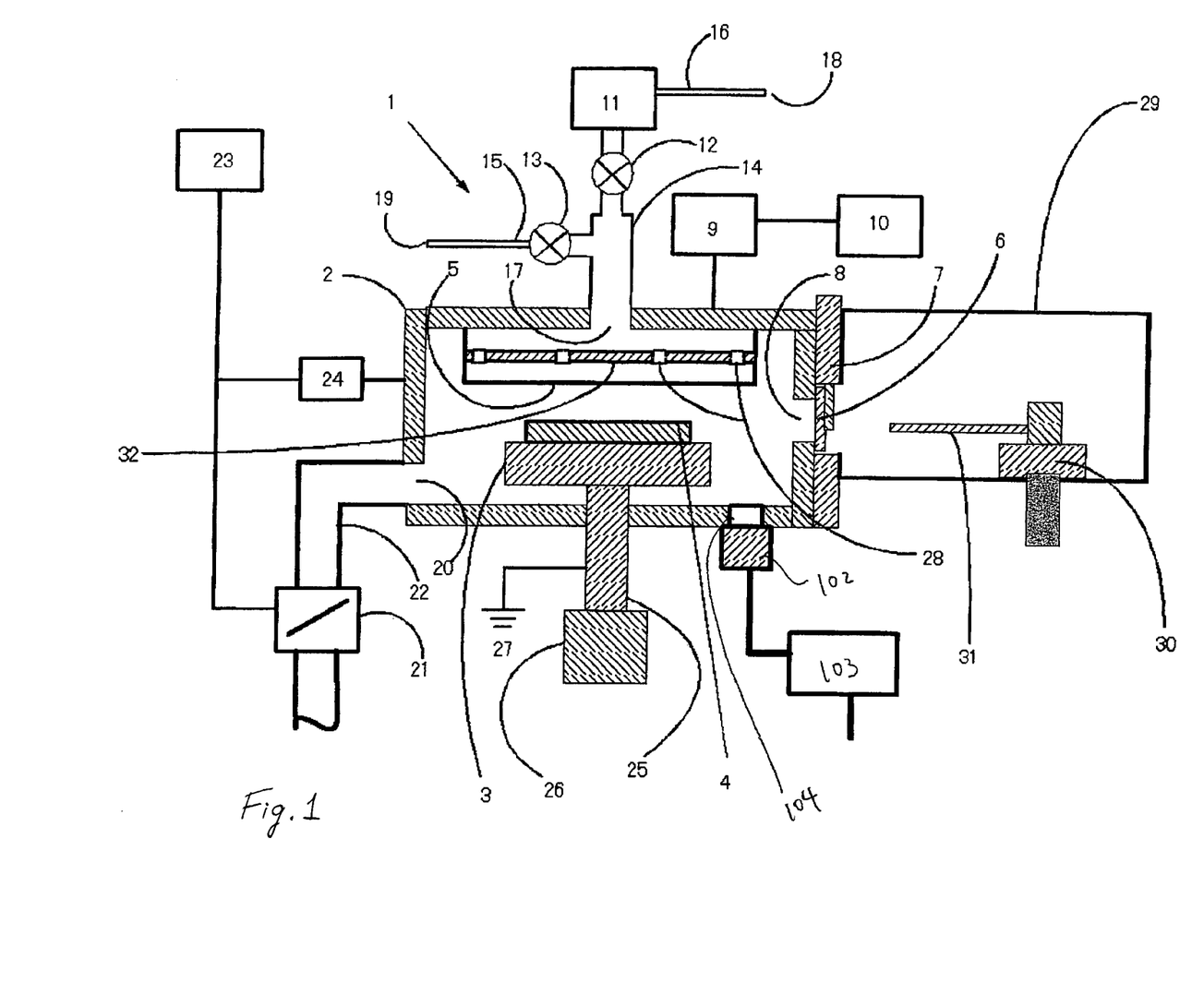
FIG. 1 is a schematic sectional view showing a plasma CVD apparatus according to an embodiment of the present invention.

FIG. 1 is a schematic sectional view showing a plasma CVD apparatus according to an embodiment of the present invention. The drawings are oversimplified for illustration purposes.

A plasma CVD apparatus 1 for forming a thin film on a semiconductor substrate 4 according to an embodiment of the present invention comprises a rector 2, a susceptor 3 for placing the semiconductor wafer 4 thereon disposed inside the reactor 2, a showerhead 5 for jetting out reaction gas uniformly onto the semiconductor wafer 4 provided facing the susceptor 3, an exhaust port 20 for exhausting gas inside the reactor 2, and a remote plasma discharge chamber 11 disposed separately from the reactor 2 and connected to the showerhead 5 through piping 14 and a valve 12; and is characterized in that active species are generated by output energy of radio-frequency oscillation at a given frequency in the remote plasma discharge chamber 11.

An opening portion 8 is provided on a side face of the reactor 2 and the reactor 2 is connected with a transfer chamber 29 for carrying in and out semiconductor wafers through a gate valve 6.

Inside the reactor 2, the susceptor 3 for placing the semiconductor wafer 4 thereon is composed of anodized aluminum or aluminum alloy and the like and is grounded 27 to form one side of the electrodes for plasma discharge. Inside the susceptor 3, an annular heating element (not shown) is buried and the semiconductor wafer is controlled at a given temperature by a temperature controller (not shown). The susceptor 3 is connected with a driving mechanism 26 for moving the susceptor 3 vertically through a supporting structure 25.

A material used for the susceptor 3 for placing the semiconductor 4 thereon is not limited to the above-mentioned anodized aluminum or aluminum alloy, and any material tolerant to activated cleaning gas may be used including a ceramic heater. The ceramic heater has a ceramic base and a metallic body forming the other side of the electrodes for plasma charge along with a resistance-heating element buried therein. The metallic body is grounded to be used as an electrode for plasma discharge. The ceramic base is composed of a material such as aluminum nitride, magnesium oxide and aluminum oxide excelling in corrosion resistance and having sufficient heat conductivity as a heater. Tungsten is used for the resistance heating element; tungsten or molybdenum can be used for the metallic body which is an electrode for plasma discharge.

Inside the reactor 2, a showerhead 5 is installed in a position facing the susceptor 3. In the showerhead 5, thousands of fine pores are provided for jetting out reaction gas to the semiconductor wafer 4. The showerhead 5 is electrically connected with a radio-frequency oscillator 10 through a matching circuit 9 and forms one side of the electrodes for plasma discharge. From the showerhead 5, a reaction gas inlet pipe 15 for introducing reaction gas for film formation is connected with piping 14. The reaction gas inlet pipe 15 is not limited to only one, and the number of pipes corresponding to reaction gas types can be provided. One end of the reaction gas inlet pipe 15 forms a gas inflow port 19 for allowing reaction gas to flow in; the other end is connected with the piping 14 through a valve 13. Reaction gas is introduced from a gas outflow port 17 into the reactor 2 through the piping 14, passes through opening portions 28 of a current plate 32, and is introduced a process space including a semiconductor wafer 4 from the fine pores provided in the showerhead 5.

At least a surface of the showerhead facing the susceptor is composed of a material having resistance to activated cleaning gas such as anodized aluminum and aluminum alloy.

On a side wall of the reactor 2, an exhaust port 20 is provided. The exhaust port 20 is connected with a vacuum exhaust pump (not shown) through piping 22. Midway between the exhaust port 20 and the vacuum pump, a conductance-regulating valve 21 for regulating a pressure inside the reactor is provided. The conductance-regulating valve 21 is electrically connected with an external controller 23.

Additionally, preferably a pressure gauge 24 for measuring a pressure inside the reactor is provided. The pressure gauge 24 is electrically connected with the controller 23.

A remote plasma discharge chamber 11 is disposed at a distance from the reactor 2. Although the present invention can accommodate an embodiment without a remote plasma discharge chamber, a remote plasma discharge chamber is used in this embodiment. The remote plasma discharge chamber 11 is composed of anodized aluminum alloy, etc.

The remote plasma discharge chamber 11 is linked with the gas outflow port 17 of the reactor 2 through the piping 14. Midway through the piping 14, a valve 12 is provided. The piping 14 is a linear structure, and has an internal diameter of at least ½ inch, preferably 1 inch or more. Additionally, the valve 12 is characterized in that there is no structure restricting a flow in an inner flow path when the valve 12 is opened. An internal diameter of the flow path is not extremely smaller than an internal diameter of the piping 14, preferably the same as that of the piping 14. The piping 14 is composed of aluminum or aluminum alloy, but may be composed of stainless steel excelling in corrosion resistance. One end of the piping 14 is connected with the remote plasma discharge chamber 11; the other end forms the gas outflow port 17 for introducing cleaning gas into the showerhead 5. Further, a cleaning gas inflow port 18 for introducing cleaning gas into the remote plasma discharge chamber 11 is provided. After controlled to a given flow by a mass flow controller (not shown), cleaning gas is guided to the cleaning gas inflow port 18, and reaches the remote plasma discharge chamber 11 through piping 16.

The piping 14 and the valve 12 are heated at a temperature preventing surface absorption of reaction gas or cleaning gas by a heater (not shown). A temperature is arbitrarily selected according to a type of reaction gas or cleaning gas. Further, if necessary, a portion from the piping 14 to the gas inflow port 19 through the reaction gas inlet pipe 15 and the valve 13 is heated at a given temperature by a heater (not shown).

Reaction gas introduced from the gas outflow port 17 into the reactor 2 is flow-controlled by the current plate 32, and introduced into the showerhead 5 from plural opening portions 28 of the current plate 32.

The current plate 32 is composed of a ceramic having a thickness of 3-20 mm, preferably 5-10 mm. As a ceramic, single crystal Al2O3 is preferable.

In the above-mentioned embodiment, in order to form a thin film on a semiconductor wafer inside the reactor 2, the radio-frequency oscillator 10 applying radio-frequency power to the showerhead 5 is used. Radio-frequency power of one frequency or a resultant frequency of two frequencies, for example, frequencies selected from those in the range of 13.56 MHz-27.12 MHz or the range of 300 kHz to 27.12 MHz, is used. The radio-frequency power is guided to an impedance automatic matching box through a coaxial cable, and is connected to the showerhead 5 through a radio-frequency transmission member. When a thin film is formed on a semiconductor wafer 4, required gas for film formation is introduced from the port 19 to the reactor 2 by opening the valve 13; a radio-frequency plasma region is formed between the susceptor 3 holding the semiconductor wafer 4 and the showerhead 5 by applying radio-frequency power outputted from the radio-frequency oscillator 10.

Reaction products adhering to the interior of the reactor 2 due to film formation on the semiconductor wafer 4 is removed by in situ cleaning or remote plasma cleaning according to need. A method of remote plasma cleaning is achieved by activating cleaning gas to be introduced from the inflow port 16 in the remote plasma chamber 11 after a semiconductor wafer 4 for which film formation has been completed is carried out from the reactor 2, and introducing the activated cleaning gas into the reactor 2 by opening the valve 12. Operation in the remote plasma chamber 11 is auto-controlled by a controller (not shown). Specifically, a flow rate of cleaning gas flowing into the port 16 is controlled by the mass flow controller (not shown) at a given value, and radio-frequency power supplied to the remote plasma chamber 11 is also controlled at predetermined power level.

As cleaning gas, nitrogen fluoride, carbon fluoride or chlorine fluoride, a mixture gas of nitrogen fluoride or oxygen fluoride, or a mixture gas of the foregoing, oxygen or an inert gas can be used. Specifically, a mixture gas of $NF_3$, $ClF_3$, $CF_4$, $C_2F_6$, or $C_3F_8$, and oxygen, a mixture gas of $NF_3$ and nitrogen, a mixture gas of $NF_3$ and an inert gas, and a mixture gas of $ClF_3$ and an inert gas can be used. As an inert gas, helium, argon, neon, xenon, or krypton can be used.

This embodiment further comprises a mechanism detecting a cleaning endpoint in addition to the above-mentioned configuration.

An optical unit 102 which can irradiate a surface of the showerhead 5, which faces the showerhead 5, with light having monochromaticity such as monochromatic light or laser light of a specific wavelength, and receive its reflected light is installed. The optical unit 102 is controlled by a computer 103 and can irradiate a surface of the showerhead 5 with light of a specific wavelength. Reflected light from the showerhead 5 is received by the optical unit 102 and information on its intensity is transmitted to the computer 103. The optical unit 102 is mounted on a sapphire window portion 104 provided at the bottom of the reactor 2. A material having resistance to activated cleaning gas through which the light having monochromaticity and its reflected light can permeate can be used for the window portion; magnesium fluoride can be used in addition to sapphire.

A beam diameter of the light having monochromaticity is approx. 10 microns to approx. 50 mm (including 20 microns, 50 microns, 100 microns, 0.5 mm, 1 mm, 10 mm and values between the foregoing) in an embodiment. Additionally, a diameter of a light focus portion (stop) is approx. 10 microns to approx. 50 microns (preferably approx. 10 microns to approx. 20 microns) in an embodiment. As the light having monochromaticity, monochromatic light such as a discharge spark of Xe or Hg (e.g., at a wavelength of 300-1,000 nm) or a laser diode, laser light of a specific wavelength such as He—Ne laser light (e.g., at a wavelength of 500-1,600 nm), at 0.5-50 mW, can be used.

Here, irradiation and receiving light are carried out through a single window portion by a single optical unit. Irradiation and receiving light, however, may be carried out by different windows and/or using different optical units. Particularly, when an irradiating angle or a reflection angle (an optical axis) of an irradiating light is not at right angles to a reflecting surface, it is necessary to provide an irradiation window and an incidence window separately.

Additionally, as an optical unit, a unit with the above-mentioned monochromatic light emitting device provided in an irradiation portion and a photodiode device provided in a light receiving portion can be used.

Figure 3:
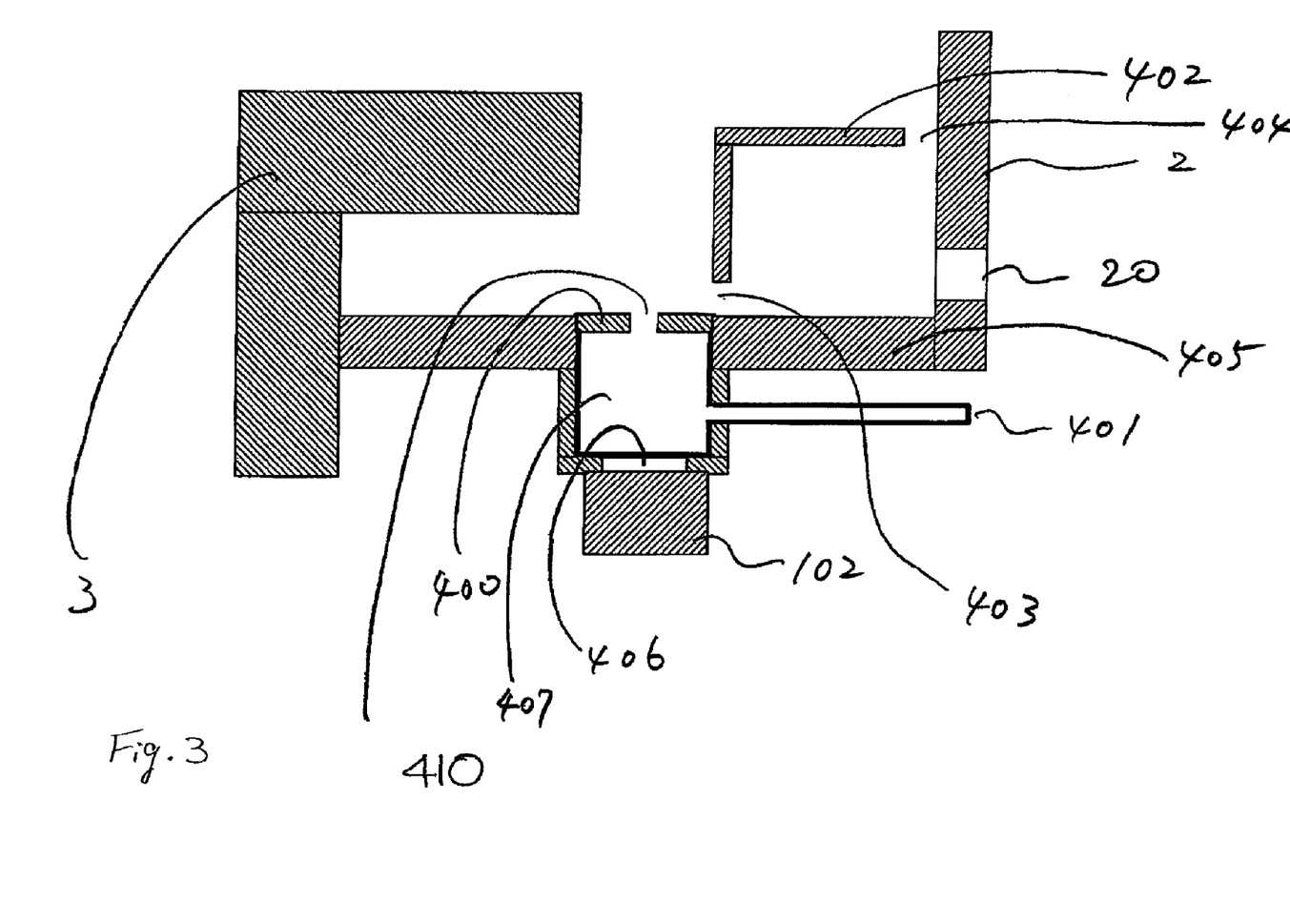
FIG. 3 is a schematic sectional view showing an optical unit according to an embodiment of the present invention.

Details of a mounting portion of an optical unit 102 in an embodiment shown in FIG. 3 are described below.

The optical unit 102 is provided at a bottom portion 405 of the reactor 2 and is able to irradiate the interior of the reactor 2 with a monochromatic light through a sapphire window 406. The sapphire window 406 has a space 407 at its upper portion and a port 401 for introducing a purge gas such as argon and helium. In order to efficiently protect the interior of the space 407 from adhesion of reaction products by the purge gas, the space 407 is connected with the interior of the reactor 2 via a plate 400 having a small hole 410. The small hole 410 is designed to allow monochromatic light irradiated from the optical unit 102 and reflected light reflected from the showerhead 5 and received by the optical unit 102 to pass through without being blocked off. The purge gas introduced from the port 401 is set to be exhausted to an exhaust port 20 from an opening portion 403 of an exhaust balancer 402 without allowing it to flow to the vicinity of a semiconductor wafer so as not to exert a bad influence such as contamination and nonuniformity on a thin film to be formed during a process of forming a film on a semiconductor wafer.

A flow rate of purge gas may be approx. 100 sccm to approx 500 sccm in an embodiment, preferably approx. 200 sccm to approx. 300 sccm. As a purge gas, Ar, He, N2, etc. can be used. A diameter of the small hole 410 may be approx. 1 mm to approx. 20 mm in an embodiment, preferably approx. 3 mm to 8 mm. A width of the opening portion 403 may be approx. 0.5 mm to approx. 5 mm in embodiment, preferably approx. 1 mm to 2 mm. A width of an upper opening portion 404 may be approx. 0.5 mm to approx. 5 mm in an embodiment, preferable approx. 1 mm to 2 mm.

Figure 4:
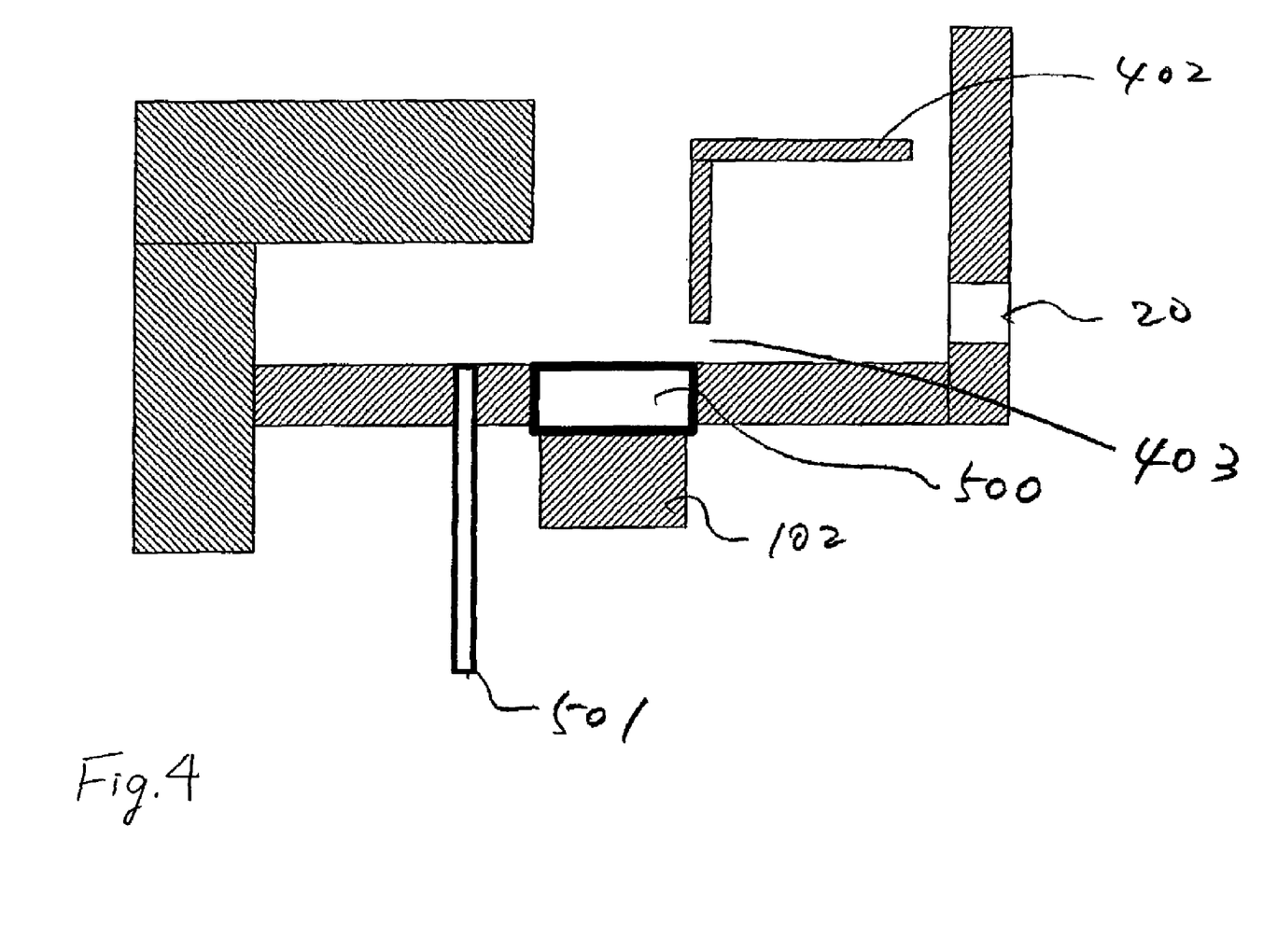
FIG. 4 is a schematic sectional view showing an optical unit according to an alternative embodiment of the present invention.

In an alternative embodiment shown in FIG. 4, a purge gas inlet port 501 is provided directly at the bottom of the reactor 2 so as to allow a purge gas to flow on a surface of the sapphire window 500 to protect a sapphire window 500. After flow-controlled at a given flow rate by a mass flow controller (not shown), the purge gas is guided to the bottom of the reactor 2 from the purge gas inlet port 501. The purge gas flows on an upper surface of the window portion 104, and its flowing is controlled by the exhaust balancer so as to protect the window portion 500 effectively from reaction products.

From a computer 103, a state of a surface of the showerhead 5 can be determined by reflected light received by an optical unit 102. Specifically, it is possible to detect whether a film adheres to a surface of the showerhead 5 during formation of a film on a semiconductor or not, and/or a degree of film adhesion during a cleaning sequence. An example of actual detection is described later.

Figure 5:
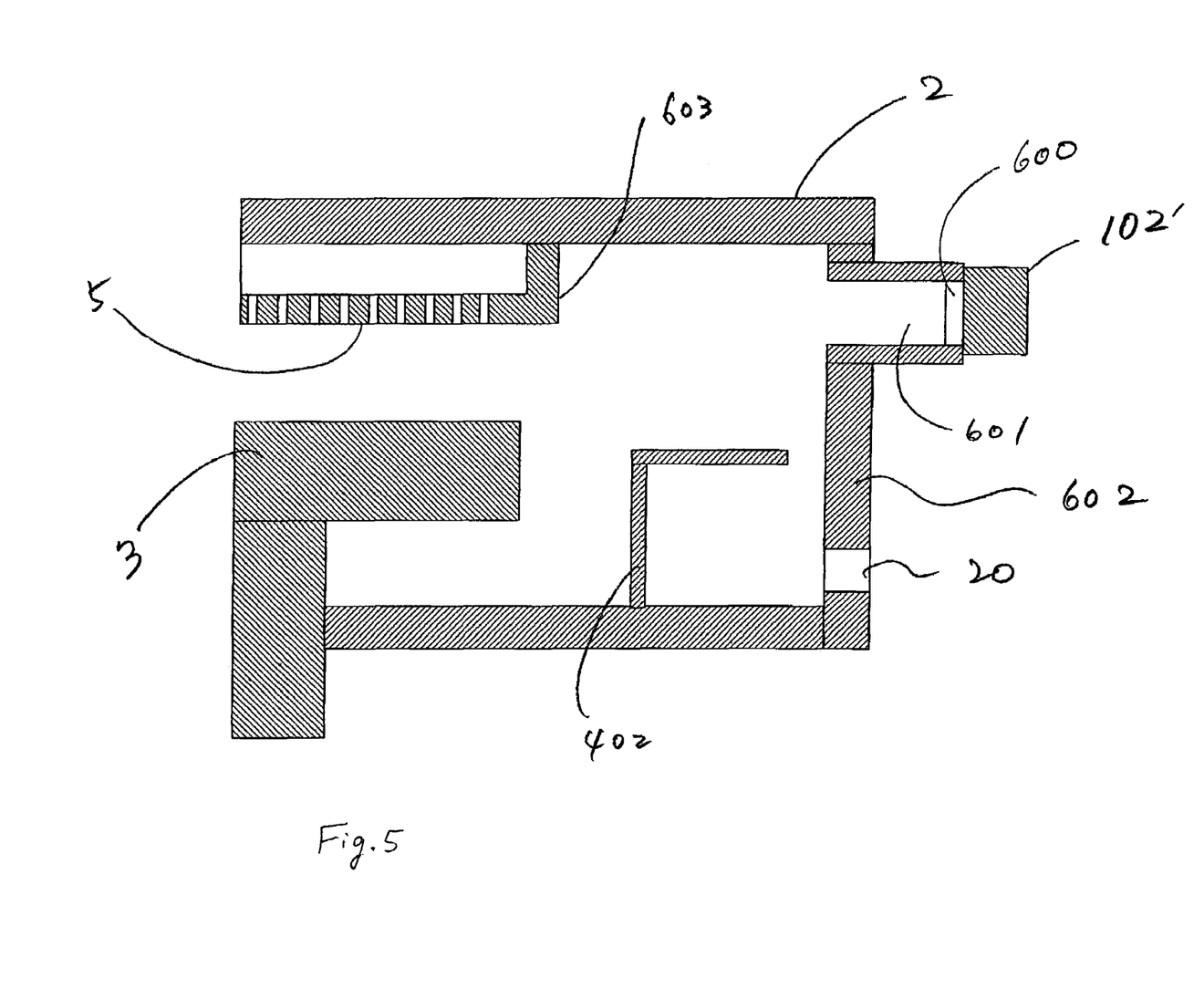
FIG. 5 is a schematic sectional view showing an optical unit according to still an alternative embodiment of the present invention.

An embodiment in which an optical unit 102' is mounted on a side wall 602 of a reactor 2 is shown in FIG. 5.

The optical unit 102' is connected with a sapphire window 600 installed in a space 600 extended from a side wall 602. The optical axis of irradiation and light received of the optical unit 102' looks toward a side surface 603 of a showerhead 5.

Returning to FIG. 1, operation of the plasma CVD apparatus according to the present invention is described. The operation is divided into two main sequences, i.e., a sequence of forming a thin film on a semiconductor wafer 4 and a cleaning sequence. First, the thin film formation sequence is described by taking a case of forming a silicon oxide film on a semiconductor wafer 4 for example, but the present invention is not limited to this example.

The interior of a reactor 2 is evacuated by an external vacuum pump (not shown) through an exhaust port 20. A pressure inside the reactor 2 can be regulated, for example, in the range of approx 1 Torr to approx. 8 Torr according to an opening of a conductance regulating valve 21.

A susceptor heated by a heating element (not shown) is controlled at a given temperature (e.g., approx. 300° C. to approx. 420° C.) by a temperature controller (not shown).

After that, reaction gas, TEOS ($Si(OC_2H_5)_4$) or O2, which is flow-controlled by a mass flow controller (not shown) is supplied from a reaction gas inflow port 19, and introduced into the reactor 2 from a gas outflow port 17 after passing through a valve 13 and piping 14.

After flow-controlled by a current plate 32, reaction gas is jetted out uniformly from fine pores formed in a downside surface of the showerhead 5 toward a semiconductor wafer 4.

Inflow of reaction gas $Si(OC_2H_5)_4$ or O2 into a remote plasma discharge chamber 11 is prevented by closing a valve 12.

13.56 MHz radio-frequency power or resultant radio-frequency power of 13.56 MHz and 430 kHz is applied to the showerhead 5. As a result, a plasma reaction zone is formed between the showerhead, one side of the electrodes, and a susceptor 3, the other side of the electrodes. Reaction gas molecules inside the zone are activated by plasma energy and a silicon oxide film is formed on a semiconductor substrate.

Additionally, not applying only to a silicon oxide film, a thin film formed on a substrate can be C-doped silicon oxide, silicon nitride, silicon carbide, N-doped silicon carbide, fluorine-doped silicon oxide, etc.; these films can be subject to cleaning, because they adhere to an inner wall of a reactor as contaminants during film formation.

A cleaning sequence in an embodiment is described below, but the present invention is not limited to this sequence.

In an apparatus shown in FIG. 1, while a sequence of forming a thin film on a substrate is repeated inside a CVD reactor continuously, unnecessary products adhere to an inner wall of the reactor 2 and a surface of a susceptor or a surface of a showerhead 5. Undesired products are gradually accumulated, flake off and float inside the reactor, causing particle contamination. Consequently, it is necessary to clean the interior of the reactor 2 regularly (e.g., after every thin film formation processing is completed, or after several times of thin film formation processing are completed). A cleaning sequence for removing silicon oxide adhering to an inner wall of the reactor 2 is described below.

A cleaning gas which is a mixture gas of $NF_3$ and argon or the like is flow-controlled at a given flow rate and supplied to a cleaning gas inflow port 18, and is introduced into a remote plasma discharge chamber 11. Inside the remote plasma discharge chamber 11, a radio-frequency output of approx. 300 kHz to approx. 500 kHz is applied to the cleaning gas at approx. 1,000 W to approx. 5,000 W. By this energy, the cleaning gas is dissociated and activated at given efficiency, generating fluoride active species.

The generated fluorine active species is introduced to a current plate 32 and to the showerhead 5 through piping 14 and a valve 12. The active species jetted out evenly to the interior of the reactor 2 from the showerhead 5 causes a chemical reaction with solid silicon oxide adhering to an inner wall of the reactor, etc., and decomposes solid adhesive substances into gaseous materials. As a result, although the number of gas molecules inside the reactor increases, a pressure inside the reactor is always kept constant by controlling an opening of a conductance regulating valve 21 by a controller 23 in response to an internal pressure of the reactor 2 measured by a pressure gauge 24. The piping 14 and the valve 12 are heated at least at 100° C. so as to be able to purge gas flowing inside the reactor swiftly.

After silicon oxide thin film formation is carried out continuously, for example, for four pieces of wafers, by regulating an internal pressure of the reactor (at e.g., approx. 100 Pa to approx. 1,000 Pa), introducing cleaning gas into the remote plasma discharge chamber 11 and applying radio-frequency power (of, e.g. approx. 300 kHz to approx. 500 kHz at approx. 1,000 W to approx. 5,000 W), active species is generated, and unnecessary silicon oxide adhering to an inner wall of the reactor 2 is removed (at a rate of approx. 0.4 micron/min to approx. 5 micron/min).

Figure 2:
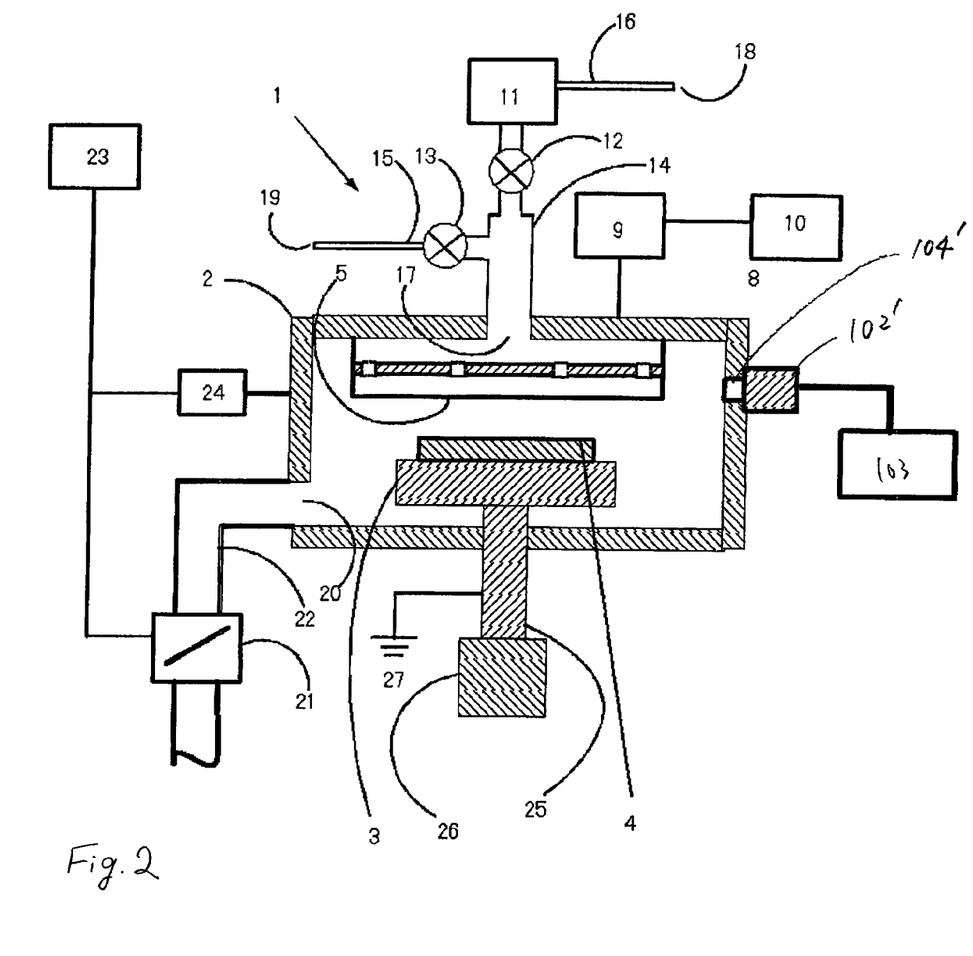
FIG. 2 is a schematic sectional view showing a plasma CVD apparatus according to an alternative embodiment of the present invention.

It is empirically known that a region for which a cleaning rate is the slowest is a showerhead surface. In the apparatus shown in FIG. 1, a plane in the periphery of the showerhead is set as a measurement point. In order to allow a light from the measurement point to come in perpendicularly and to reflect by conforming an optical axis of irradiation of monochromatic light with that of its reflected light (i.e., a single optical unit and a single window portion are adopted), the window portion is installed on a bottom wall of the reactor in the vicinity of the susceptor. If an external diameter of the showerhead is larger than that of the susceptor, such construction can be adopted. If an external diameter of the showerhead is equal to or smaller than that of the susceptor, such construction cannot be adopted. In this case, as in the apparatus shown in FIG. 2, by providing a measurement point on a side surface of the showerhead, a window portion may be installed on a side wall of the reactor. Additionally, by not conforming an optical axis of an incident light with an optical axis of reflected light, but by adjusting an irradiating angle and a reflection angle, the front of the showerhead is set as a measurement point; by not providing a window portion at a bottom wall of the reactor, it is also possible to provide a window portion for irradiation and a window portion for receiving light respectively on side walls facing each other. Additionally, according to a configuration of the reactor, a measurement point may be set up on an inner wall except that of the showerhead. In either case, preferably a wall surface for which a cleaning rate is slower may be selected as a measurement point.

Additionally, a region of the showerhead 5 irradiated with monochromatic light or laser light can be a surface anodized after being polished to a mirror finished surface; or a material such as sapphire (e.g., with a diameter of approx. 1-10 mm, a thickness of approx. 3-15 mm) which is not corroded by cleaning gas and film formation gas can be attached to the region.

Presence of contaminants inside the reactor and a degree of accumulation are observed as a change in the intensity of reflected light or can be observed as interference of reflected light from a showerhead surface or an inner wall surface of the reactor with reflected light from a contaminant layer. Preferably, using both intensity change and reflected light interference, an endpoint may be identified. In either case, at a point of time when a change cannot be observed substantially, approximately, or completely, that point can be identified as a cleaning endpoint. Additionally, because such a change can be taken out as electrical signals, it can be automatically controlled by inputting a cleaning sequence into a computer.

For example, a point of time when the intensity of reflected light reaches a prescribed value or less (e.g., the intensity at an endpoint is evaluated in advance, when the intensity reaches that value +10%, 5%, 1%, or 0%) can be set as an endpoint; a point of time when a differential quantity of a change in the intensity of reflected light becomes a prescribed value or less (e.g., a differential value is in the vicinity of zero, or zero, or a change rate per second becomes 5% or less, 1% or less, 0%) and the value continues for a prescribed period of time (e.g., 2 sec, 3 sec, 5 sec, 10 sec) can be set as an endpoint; further, considering an integral quantity of the reflected light intensity, a point of time when it reaches a prescribed value or less can be set as an endpoint; or a point of time when a prescribed period of time elapses (e.g., 5 sec, 10 sec, 20 sec) after interference signal no longer occurs (after a convergence) can be set as an endpoint. Further, by setting measurement start contingent on detection of periodical change in the reflected light intensity by interference signals, subsequently measurement of the reflected light intensity may be taken as mentioned above.

Additionally, occurrence of an interference signal and its cycle relate to a wavelength of light used, a refractive index of a film, a film thickness, etc. Consequently, it is preferable to verify whether an interference signal occurs or not using a target film in advance; and monochromatic light used may be selected according to each target film. Additionally, by allowing a combination of monochromatic lights of plural wavelengths to be irradiated and reflected, it makes it possible to detect a cleaning endpoint even when a film type or a film thickness is changed to same extent.

Embodiments

Film formation was executed using a CVD apparatus shown in FIG. 1. 250 sccm of TEOS (250 cc per 1 min, 0° C., 1 atm) and 2,300 sccm of oxygen were supplied into a reactor 2; while maintaining a pressure inside the reactor 2 at 400 Pa, by applying 13.56 MHz radio-frequency power at 650 W and 430 kHz radio-frequency power at 500 W to the showerhead 5, a plasma discharge zone was formed between the susceptor on which a φ300 mm silicon wafer is placed and the showerhead 5. As a result, in 40 sec., a 500 nm thick silicon oxide film having uniformity ±1.5% (a value obtained by measuring a film thickness of a 500 nm thick silicon oxide film grown on the silicon wafer at 49 points and dividing a difference between the maximum value and the minimum value of measured values by ½ of an average value of all measured values and expressing it in percentage) was able to be formed on the silicon wafer.

Upon completion of a thin film formation process, the valve 13 was closed and simultaneously the gate valve 6 was opened. The processed semiconductor wafer 4 (silicon wafer) was carried out to an adjacent transfer chamber by a blade 31 of an automatic transfer robot 30 through the opening portion 8. After the reactor 2 is evacuated, an unprocessed semiconductor wafer was carried in from the transfer chamber, and the gate valve was closed. The above-mentioned sequence was repeated again (four wafers were processed here).

After the film formation sequences were completed, a cleaning sequence for cleaning the interior of the reactor 2 was started.

After formation of the above-mentioned 500 nm thick silicon oxide film was executed on four wafers continuously, by using 1.2 slm of NF3 and 5 slm of Ar as cleaning gas, setting an internal pressure of the reactor 2 at 650 Pa, and applying 400 kHz radio-frequency power at 2,700 W into the remote plasma discharge chamber 11, fluorine-containing active species were generated.

Generated fluorine-containing active species were introduced into the current plate 32 and into the showerhead 5 through the piping 14 and the valve 12. The fluorine-containing active species jetted out uniformly into the interior of the reactor 2 from the showerhead 5 reacted chemically with solid silicon oxides adhering to an inner wall of the reactor, etc., and decomposed solid adhesive substances into gaseous materials. As a result, although the number of gas molecules inside the reactor increased, a pressure inside the reactor was always kept constant by controlling an opening of the conductance-regulating valve 21 in real-time by the controller 23 in response to a pressure inside the reactor measured by the pressure gauge 24. The piping 14 and the valve 12 were heated at least at 100° C. so as to enable to purge gas passing through the interior swiftly. As a result, unnecessary silicon oxides adhering to the inner wall of the reactor 2 were able to be removed at a rate of 1.36 micron/min.

Figure 6:
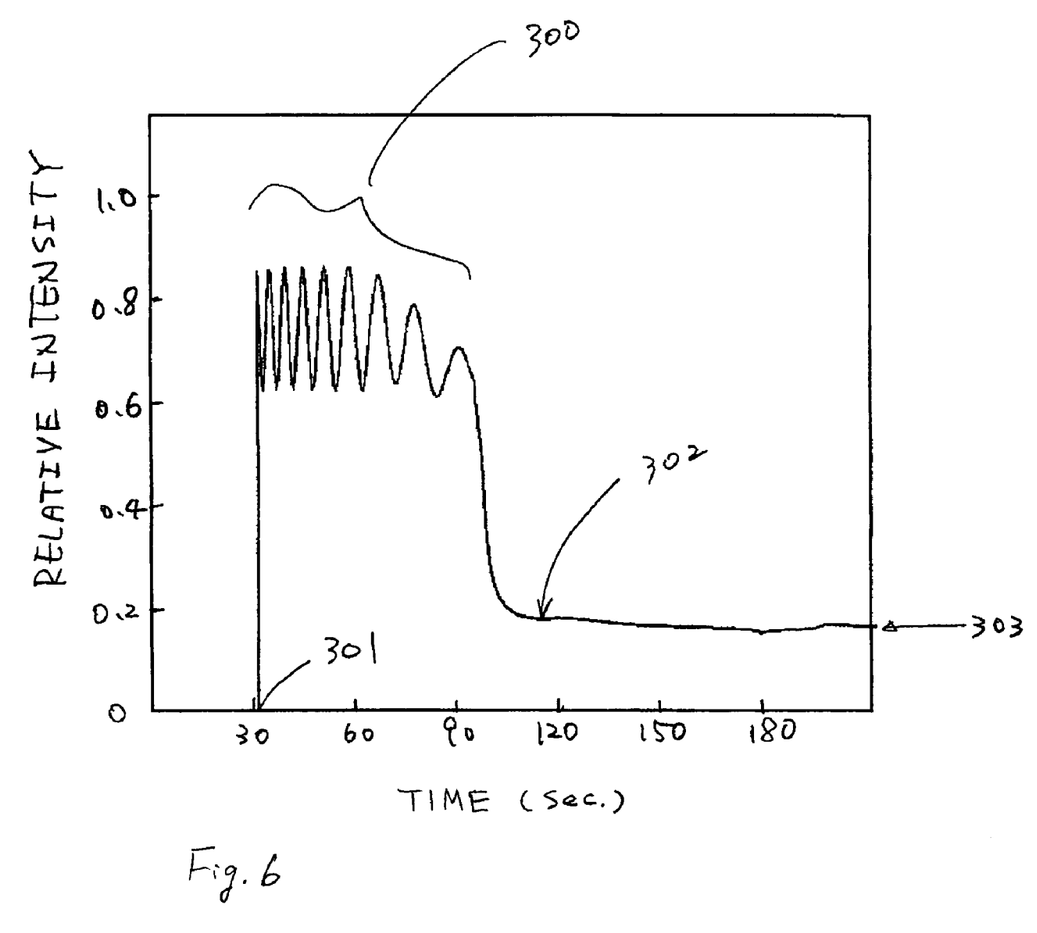
FIG. 6 is a graph showing an example of cleaning endpoint detection according to an embodiment of the present invention.

In FIG. 6, the intensity of 690 nm laser light reflected from the showerhead 5 during the cleaning is shown. When cleaning the interior of the reactor 2 by introducing activated cleaning gas into the reactor 2, 690 nm laser light was irradiated to a surface of the periphery of the showerhead 5 from the optical unit 102, and its reflected light was received by the optical unit 102. Additionally, during the cleaning, approx. 250 sccm of a purge gas (Ar) for protecting the sapphire window 406 was supplied from the fine pores 401. Laser light was detected as interference signals 300 shown in FIG. 6 (Detection was started from the measurement point 301.) as light reflected on a surface of a silicon oxide film adhering to a surface of the shower head 5 interfered with light reflected on a surface of showerhead 5. A horizontal axis is a cleaning time scale in sec. and a vertical axis is a relative intensity scale (with the maximum reflection intensity deemed as 1). As a thickness of the silicon oxide film adhering to the surface of the showerhead 5 decreased, interference signals changed periodically. When the silicon oxide film adhering to the surface of the showerhead 5 was eliminated, and the interference with the reflected light ceased to occur, the intensity of the reflected light itself decreased and became stabilized at a level of 303.

By this, a point of time 302 when the intensity of reflected light reached at a level of 303 was able to be recognized as a leaning endpoint.

As explained above, according to one or more embodiments of the present invention, in reactor cleaning using a remote plasma discharge chamber, it becomes possible to prevent deterioration of the electrodes used for CVD by ion bombardment during the cleaning and to detect reliable cleaning completion simultaneously.

Additionally, according to one or more embodiments of the present invention, it becomes possible to directly detect whether adhesive substances are present or not in the periphery of the showerhead in which a cleaning rate is the slowest; and stable apparatus operation and high throughput can be assured because it becomes possible to achieve complete cleaning and to proceed to the next process promptly.

Further, according to one or more embodiments of the present invention, by a cleaning completion signal detected, it becomes possible to control a cleaning sequence; even if a sequence storing an instruction for terminating a cleaning sequence before this cleaning completion signal is detected is executed, (1) it becomes possible that a CVD apparatus is able to detect an incomplete state and stop its operation or issue an alarm if the cleaning has not been completed, (2) it becomes possible to control the cleaning sequence by inputting a cleaning completion signal in a controller provided for the apparatus.

Embodiments of the present invention were described above, but the present invention is not limited to those embodiments and includes the following aspects as well:

1) A substrate processing apparatus having a reactor, a remote plasma discharge chamber disposed remotely from the reactor, and piping connecting the reactor and the remote plasma discharge chamber, which cleans the interior of the reactor by activating cleaning gas by plasma discharge energy excited in the remote plasma discharge chamber, introducing the activated cleaning gas into the reactor through the piping, and decomposing solid substances adhering to the interior of the reactor during film formation processing into gaseous materials, wherein in a step of removing products adhering to the interior of the reactor by the activated cleaning gas, progress of a substrate processing sequence is controlled based on voltage information occurring in the electrodes for reaction gas excitation provided inside the reactor, which is obtained by applying radio-frequency power to the electrodes inside the reactor.

2) A substrate processing apparatus having a reactor, a remote plasma discharge chamber disposed remotely from the reactor, and piping connecting the reactor and the remote plasma discharge chamber, which cleans the interior of the reactor by activating cleaning gas by plasma discharge energy excited in the remote plasma discharge chamber, introducing the activated cleaning gas into the reactor through the piping, and decomposing solid substances adhering to the interior of the reactor during film formation processing into gaseous materials, wherein in the step of removing products adhering to the interior of the reactor by the activated cleaning gas, the reflection intensity of laser light irradiated to an internal surface of the reactor is measured.

3) The apparatus described in 2) above, which is characterized in that completion of a cleaning step is determined based on measurement information of the reflection intensity of the laser light.

4) The apparatus described in 3) above, wherein the internal surface of the reactor to which the laser light is irradiated is a surface of an electrode for reaction gas excitation provided inside the reactor and a portion in which a removal rate of substances to be cleaned is the slowest.

5) The apparatus described in 3) above, wherein the internal surface of the reactor to which the laser light is irradiated is a surface of an electrode for reaction gas excitation provided inside the reactor, and a surface of the showerhead disposed facing a substrate or any portion with which a removal rate for the interior of the reactor is reproducible.

6) The apparatus described in 3) above, wherein the internal surface of the reactor to which the laser light is irradiated is a surface of the periphery of the showerhead disposed facing a substrate.

7) The apparatus described in 6) above, wherein the surface of the periphery of the showerhead is a ceramic surface provided around the showerhead.

8) A substrate processing apparatus having a reactor, a remote plasma discharge chamber disposed remotely from the reactor, and piping connecting the reactor and the remote plasma discharge chamber, which cleans the interior of the reactor by activating cleaning gas by plasma discharge energy excited in the remote plasma discharge chamber, introducing the activated cleaning gas into the reactor through the piping, and decomposing solid substances adhering to the interior of the reactor during film formation processing into gaseous materials, wherein in a step of removing products adhering to the interior of the reactor by the activated cleaning gas, reflected light of monochromatic light irradiated to an internal surface of the reactor is measured.

9) The apparatus described in 8) above, wherein in the cleaning step, by irradiating a film formed on an internal surface of the reactor due to film formation processing with monochromatic light and detecting its reflected light, a removal state of the film formed on the internal surface of the reactor is detected.

10) The apparatus described in 9) above, which is characterized in that in the cleaning step, monochromatic light is irradiated to a film formed on an internal surface of the reactor due to film formation processing, and in a step of detecting a removal state of the film formed on the internal surface of the reactor by its reflected light, time required for the cleaning step is determined by detecting a point of time when interference of monochromatic light reflected from the uppermost surface of the film with monochromatic light reflected from the internal surface of the reactor disappears.

11) A substrate processing apparatus having a reactor, a remote plasma discharge chamber disposed remotely from the reactor, and piping connecting the reactor and the remote plasma discharge chamber, which cleans the interior of the reactor by activating cleaning gas by plasma discharge energy excited in the remote plasma discharge chamber, introducing the activated cleaning gas into the reactor through the piping, and decomposing solid substances adhering to the interior of the reactor during film formation processing into gaseous materials, which is characterized in that the apparatus comprises the periphery of a showerhead provided facing a substrate, on which film formation is executed inside the reactor, a monochromatic light radiation unit emitting monochromatic light provided outside the reactor, a monochromatic light receiver receiving monochromatic light, and a monochromatic light passing member provided in the reactor; and monochromatic light emitted from the monochromatic light radiation unit is irradiated to the periphery of the showerhead via the monochromatic light passing member, and monochromatic light reflected from the periphery of the showerhead comes into the monochromatic light receiving portion via the monochromatic light passing member.

12) The substrate processing apparatus which is characterized in that the monochromatic light passing member is provided on a wall surface of the reactor facing a side surface of the showerhead.

13) The substrate processing apparatus which is characterized in that the monochromatic light passing member is provided on a wall surface of the reactor facing a side surface of the showerhead.

14) A substrate processing apparatus having a reactor, a remote plasma discharge chamber disposed remotely from the reactor, and piping connecting the reactor and the remote plasma discharge chamber, which cleans the interior of the reactor by activating cleaning gas by plasma discharge energy excited in the remote plasma discharge chamber, introducing the activated cleaning gas into the reactor through the piping, and decomposing solid substances adhering to the interior of the reactor during film formation processing into gaseous materials, which is characterized in that in the step of removing products adhering to the interior of the reactor by the activated cleaning gas, completion of a cleaning step is determined based on measurement information of the reflection intensity of the laser light irradiated to an internal surface of the reactor.

15) A substrate processing apparatus having a reactor, a remote plasma discharge chamber disposed remotely from the reactor, and piping connecting the reactor and the remote plasma discharge chamber, which cleans the interior of the reactor by activating cleaning gas by plasma discharge energy excited in the remote plasma discharge chamber, introducing the activated cleaning gas into the reactor through the piping, and decomposing solid substances adhering to the interior of the reactor during film formation processing into gaseous materials, wherein in the step of removing products adhering to the interior of the reactor by activated cleaning gas, a method of controlling a substrate processing sequence by measuring reflected light of monochromatic light irradiated to an internal surface of the reactor.

16) The apparatus described in 15) above, wherein in the cleaning step, a method of detecting a removal state of the film formed on the internal surface of the reactor by irradiating a film formed on an internal surface of the reactor due to film formation processing with monochromatic light and detecting its reflected light.

17) The apparatus described in 16) above, a method of operating the substrate processing apparatus which is characterized in that in the cleaning step, monochromatic light is irradiated to a film formed on an internal surface of the reactor due to film formation processing, and in a step of detecting a removal state of the film formed on the internal surface of the reactor by detecting its reflected light, time required for the cleaning step is determined by detecting a point of time when interference of monochromatic light reflected from the uppermost surface of the film with monochromatic light reflected from the internal surface of the reactor disappears.

Additionally, although the above-mentioned are embodiments of remote plasma cleaning, these embodiments also can be applied to In situ plasma cleaning.

What is claimed is:

1. A method of cleaning a CVD apparatus, comprising the steps of: removing contaminants adhering to the interior of a CVD by activating a cleaning gas; detecting a removal state of contaminants adhering to an inner surface of said reactor by irradiating the inner surface of said reactor with light having monochromaticity through an optical window provided on an inner wall of said reactor at a bottom of said reactor and receiving its reflected light; and controlling the cleaning step based on the detection of results, wherein prior to removing contaminants a purge gas is supplied, Directed to the vicinity of the optical window and exhausted to protect the optical window from reaction products while inhibiting the purge gas from flowing into a reaction space of the CVD reactor and the vicinity of a semiconductor wafer placed in the reaction space, wherein the purge gas is exhausted though one of two openings of an exhaust balancer, said one of the two openings being closer to the optical window than is another of the two openings, wherein the one of the two openings of the balancer is provided along a bottom surface of the reactor, and the another of the two openings of the balancer is provided along an inner wall of a reactor, wherein purge gas flows along the bottom surface of the reactor and an upper surface of the optical window and is exhausted through one of the two openings.

2. The method of cleaning a CVD apparatus according to claim 1, wherein said light having monochromaticity is monochromatic light.

3. The method of cleaning a CVD apparatus according to claim 1, wherein said light having monochromaticity is laser light.

4. The method of cleaning a CVD apparatus according to claim 1, wherein both irradiation with said light having monochromaticity and receiving of its reflected light are performed through the same optical window.

5. The method of cleaning a CVD apparatus according to claim 1, wherein said inner surface is a surface of a showerhead introducing reaction gas into the reactor.

6. The method of cleaning a CVD apparatus according to claim 5, wherein said inner surface is a plane in the vicinity of a periphery of said showerhead facing a susceptor for placing and heating a substrate thereon.

7. The method of cleaning a CVD apparatus according to claim 6, wherein said optical window is provided on an inner wall of said CVD reactor, which is situated in a direction perpendicular to said inner surface.

8. The method of cleaning a CVD apparatus according to claim 5, wherein said inner surface is a side surface in the vicinity of a periphery of said showerhead.

9. The method of cleaning a CVD apparatus according to claim 8, wherein said optical window is provided on an inner wall of said CVD reactor, which is situated in a direction perpendicular to said inner surface.

10. The method of cleaning a CVD apparatus according to claim 1, wherein said optical window is composed of sapphire.

11. The method of cleaning a CVD apparatus according to claim 1, wherein removal of said contaminants is detected by converging interference signals of reflected lights of said light having monochromaticity from said inner surface and from a surface of said contaminants.

12. The method of cleaning a CVD apparatus according to claim 1, wherein the mass of said contaminants is detected by reflected light intensity of said light having monochromaticity from said inner surface.

13. The method of cleaning a CVD apparatus according to claim 1, wherein said detection process is performed through said optical window provided at a bottom of a bottomed hole provided in an inner wall of said reactor.

14. The method of cleaning a CVD apparatus according to claim 1, wherein said activated cleaning gas is a cleaning gas excited in a remote plasma discharge chamber.

15. A method of forming a film by CVD, in which the cleaning method according to claim 1 is incorporated, which comprises the steps of:
    forming a film on a substrate inside said CVD reactor;
    during the film formation, introducing a purge gas for protecting a surface of said optical window from a deposition atmosphere into the vicinity of said optical window; and
    after completion of the film formation, performing the cleaning according to claim 1.

16. The method of forming a film according to claim 15, which further comprises exhausting a purge gas for protecting said optical window without allowing the purge gas to flow into the deposition atmosphere during said film formation.

17. The method according to claim 1, wherein the optical window is provided in a portion recessed from the inner wall, and the purge gas is provided into the recessed portion.

* * * * *

UNITED STATES PATENT AND TRADEMARK OFFICE
CERTIFICATE OF CORRECTION

| | |
|---|---|
| PATENT NO. | : 7,534,469 B2 |
| APPLICATION NO. | : 11/095314 |
| DATED | : May 19, 2009 |
| INVENTOR(S) | : Kiyoshi Satoh et al. |

It is certified that error appears in the above-identified patent and that said Letters Patent is hereby corrected as shown below:

At column 1, line 33, please change "Cleaning" to --cleaning--.

At column 17, line 8-31, please amend Claim 1 as follows, wherein additions are underlined and deletions are bolded and either stricken through or [[surrounded by double brackets]].

1. A method of cleaning a CVD apparatus, comprising the steps of:

removing contaminants adhering to the interior of a CVD <u>reactor</u> by activating a cleaning gas;

detecting a removal state of contaminants adhering to an inner surface of said reactor by irradiating the inner surface of said reactor with light having monochromaticity through an optical window provided on an inner wall <u>of said reactor</u> at a bottom of said reactor and receiving its reflected light; and controlling the cleaning step based on the detection [[of]] results, wherein prior to removing contaminants a purge gas is supplied, Directed <u>directed</u> to the vicinity of the optical window and exhausted to protect the optical window from reaction products while inhibiting the purge gas from flowing into a reaction space of the CVD reactor and the vicinity of a semiconductor wafer placed in the reaction space, wherein the purge gas is exhausted though <u>through</u> one of two openings of an exhaust balancer, said one of the two openings being closer to the optical window than is another of the two openings, wherein the one of the two openings of the balancer is provided along a bottom surface of the reactor, and the another of the two openings of the balancer is provided along an inner <u>side</u> wall of [[a]] <u>the</u> reactor, wherein <u>the</u> purge gas flows along the bottom surface of the reactor and an upper surface of the optical window and is exhausted through the one of the two openings.

Signed and Sealed this

Twenty-sixth Day of January, 2010

David J. Kappos
*Director of the United States Patent and Trademark Office*